United States Patent [19]

Aoki

[11] Patent Number: 5,811,030
[45] Date of Patent: Sep. 22, 1998

[54] PROCESS FOR PRODUCING SILICON COLLOID

[76] Inventor: Nobuo Aoki, c/o Nippon Oil Company, Ltd. Central Technical Research Laboratory, 8, Chidori-cho, Naka-ku, Yokohama-shi, Kanagawa, Japan

[21] Appl. No.: 322,947

[22] Filed: Oct. 13, 1994

[30] Foreign Application Priority Data

Oct. 28, 1993 [JP] Japan .................. 5-291460

[51] Int. Cl.$^6$ .................. B01J 13/00; C30B 29/06; B01D 7/00
[52] U.S. Cl. .................. 252/309; 252/314; 423/350; 117/935; 23/294 R; 250/370.01; 428/938
[58] Field of Search .................. 252/308, 309, 252/314; 423/348, 349, 350; 117/935; 502/8, 9; 250/370.01; 428/938; 204/907; 23/294 R

[56] References Cited

U.S. PATENT DOCUMENTS 5,510,095  4/1996  Aratani et al. .................. 423/348

OTHER PUBLICATIONS

Hawley's Condensed Chemical Dictionary, 10th Edition, (Van Nostrand Reinhold Company Inc., NY, NY) pp. 299–300, 1987.

Hackh's Chemical Dictionary, (McGraw–Hill, Inc., NY, NY) pp. 168–169, 1969.

Patent Abstracts Of Japan, Abstract Group No. C0987, Abstract vol.16, No. 455, JP04–161247, Sep. 22, 1992.

Wada & Ichikawa, A Method of Preparation of Finely Dispersed Ultrafine Particles, Japanese Journal of Applied Physics, vol. 15, No. 5, May, 1976, pp. 755–756.

Kimura et al., "The study of Metal Colloids Produced by Means of Gas Evaporation Techniques. I. Preparation Method and Optical Properties in Ethanol", Bull. Chem. Soc. Jpn., vol. 56, No. 12, 3578–3584 (1983).

*Primary Examiner*—Richard D. Lovering
*Assistant Examiner*—Daniel S. Metzmaier

[57] ABSTRACT

Silicon thin films of superior resistivity useful for, e.g., semiconductor elements in solar cells, are formed by coating and drying silicon vaporized in the presence of hydrogen alone or hydrogen and an inert gas, followed by contacting the thus produced silicon particles with solvent to form a silicon colloid. Preferably, the silicon colloid is produced by a process which comprises vaporizing silicon in an atmosphere consisting essentially of hydrogen and up to 10 mol of an inert gas per mol of hydrogen; condensing silicon vaporized in the first step to form fine silicon particles; bringing the silicon particles into contact with a solvent to cover the silicon particles with solvent, and collecting the solvent covered silicon particles to obtain the silicon colloid.

15 Claims, 1 Drawing Sheet

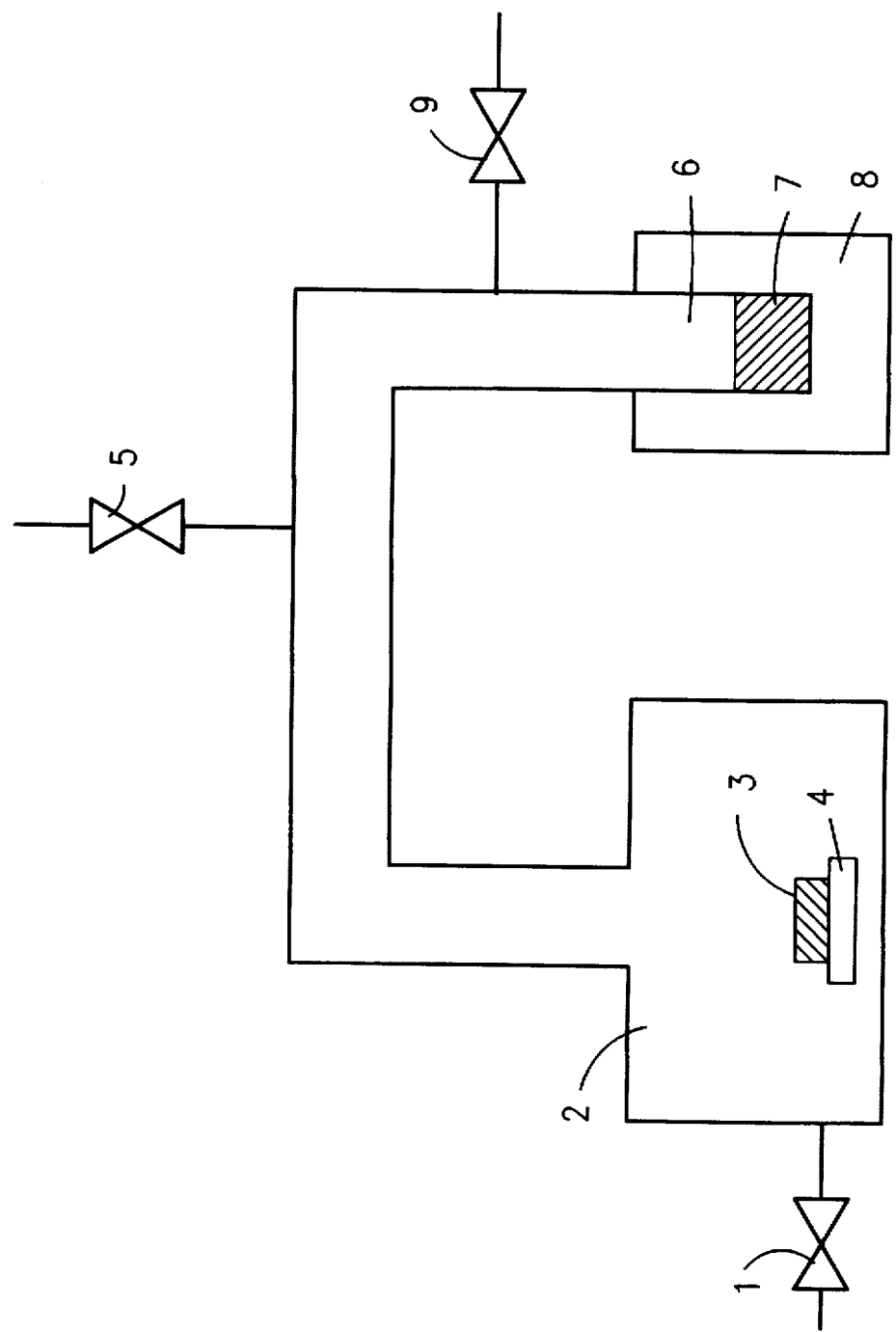

PROCESS FOR PRODUCING SILICON COLLOID

FIELD OF THE INVENTION

The present invention relates to a process for producing a silicon colloid and a method of forming a thin silicon film from the colloid. More particularly, this invention relates to a process for producing a silicon colloid suitable for use in forming a thin silicon film to be used as a semiconductor element in solar cells or other devices, and to a method of forming such a thin silicon film from the colloid.

BACKGROUND OF THE INVENTION

When a dispersion obtained by dispersing ultrafine metal particles having particle diameters of 100 nm or less into a solvent so that the particles are homogeneously separated from one another, i.e., a so-called metal colloid, is used, a thin metal film can be formed by only coating the colloid and then evaporating the solvent to dry the coating. Because of this, metal colloids as precursors for thin metal films are receiving attention in recent years.

Metal colloids are being produced by a process in which a metal is vaporized in an inert gas to form ultrafine metal particles and a solvent vapor is introduced into the vessel to collect the particles while covering each ultrafine particle with solvent molecules before the ultrafine particles aggregate. This process for metal colloid production has conventionally been known widely and is described in detail in, e.g., *Japanese Journal of Applied Physics*, Vol.15, No.5, pp. 755–756(1976).

Colloids of metals such as gold, silver, platinum, and palladium have been produced so far, and thin metal films having the same performances as the corresponding bulk metals are formed from these metal colloids. With respect to silicon, however, the silicon colloid produced by the above-described process at present only gives thin films which are inferior in resistivity and other performances to bulk silicon.

Hence, there currently is a strong desire in the industry for the development of a silicon colloid from which a thin silicon film having the same performances as bulk silicon can be formed by coating and drying.

SUMMARY OF THE INVENTION

An object of the present invention is to provide a process for producing a silicon colloid from which a thin silicon film can be formed which is equal in resistivity and other electrical properties to bulk silicon.

As a result of intensive studies made in order to overcome the problem described above, it has surprisingly been found that vaporization of silicon in the presence of hydrogen enables the production of a silicon colloid from which a thin silicon film equal in performances to bulk silicon can be obtained by coating and drying. The present invention has been completed based on this finding.

Accordingly, the present invention relates to a process for producing a silicon (Si) colloid which comprises vaporizing silicon in the presence of hydrogen and bringing the resulting silicon particles into contact with a solvent. This invention further relates to a method of forming a thin silicon film from the silicon colloid obtained by the process.

BRIEF DESCRIPTION OF THE DRAWING

FIG. 1 is a schematic view illustrating an apparatus for practicing the process of the invention for producing a silicon colloid.

DETAILED DESCRIPTION OF THE INVENTION

The silicon to be used as a raw material in this invention is not particularly limited, but one for use as a semiconductor element for solar cells or other devices is usually preferred.

Examples of the silicon as a semiconductor element for solar cells or other devices include silicon which is not doped with impurities, p-type silicon doped with e.g., boron and n-type silicon doped with e.g., arsenic, but p-type or n-type silicon is usually used.

The silicon as a raw material usually has a resistivity of $10^{-2}$ to 10 $\Omega$cm.

Methods for vaporizing silicon are not particularly limited, and all of the techniques conventionally employed for metal colloid production are usually usable, such as the resistive heating method and sputtering method. Although silicon colloids have conventionally been produced by vaporizing silicon in the presence of an inert gas, the silicon colloids thus produced have only given thin films with poor resistivities. According to the present invention, it has become possible to produce a silicon colloid capable of forming a thin film with an excellent resistivity by vaporizing silicon in the presence of hydrogen alone or of hydrogen and an inert gas.

Heat conditions in vaporizing are not particularly limited as long as the silicon as a raw material is vaporized, but the silicon is usually heated to a temperature of 1000° to 1500° C., preferably 1200° to 1400° C.

In the process of the invention for producing a silicon colloid, the system is first evacuated to 0.1 Torr or less. Hydrogen is then introduced in such an amount that the resulting pressure is in the range of usually from 0.2 to 100 Torr, preferably from 1 to 20 Torr. Pressures less than 0.2 Torr are undesirable in that the thin films formed from the silicon colloid thus yielded have too high resistivities. On the other hand, pressures more than 100 Torr are undesirable in that coarser silicon particles having a large particle size are yielded and the colloid gives a thin film which is uneven in thickness.

The vaporization step may be conducted in the presence of an inert gas besides hydrogen. Representative examples of the inert gas are the rare gases, i.e., helium, neon, argon, krypton, xenon, and radon, with helium and argon being especially preferred. The partial pressure of the coexistent inert gas is not particularly limited, but the inert gas may be used in an amount of usually up to 10 mol, preferably in the range of from 1 to 5 mol, per mol of the hydrogen.

The particulate silicon thus formed by vaporizing silicon in a hydrogen atmosphere or in an atmosphere of hydrogen and an inert gas are brought into contact with a solvent introduced into the system. Desirable as this solvent is an organic solvent such as an ether, alcohol, or ester. In particular, alcohols having 1 to 15 carbon atoms are preferred, examples of which include methanol, ethanol, propanol, isopropanol, butanol, pentanol, hexanol, heptanol, octanol, nonanol, decanol, α-terpineol, undecanol, dodecanol, tridecanol, tetradecanol, and pentadecanol. It is, of course, possible to likewise use the structural isomers and position isomers of these alcohols, such as branched isomers, cyclic isomers, and isomers which differ from the above-enumerated alcohols in the position of the hydroxyl group. Especially preferred of these alcohols are methanol, ethanol, isopropanol, and α-terpineol. The pressure of the solvent when introducing into the system is not limited as long as it is higher than the pressure in a vaporization chamber, but the solvent is usually introduced into the system at a pressure of 1 atm.

Upon contact with the solvent, the silicon particles each is covered with the solvent. By collecting the silicon particles thus covered with the solvent, the desired silicon colloid is obtained. Methods for collection are not particularly limited. For example, use may be made of a method comprising cooling the solvent-covered silicon particles to, e.g., −100° to 10° C. to directly obtain a liquid colloid, or a method in which the solvent-covered silicon particles are first cooled to, e.g., −250° to −50° C. with a refrigerant, e.g., liquid nitrogen, to collect the solvent-covered silicon particles in a solid state and the solid is then converted to a liquid state by heating it to, e.g., 0° to 50° C. to obtain a silicon colloid.

In the silicon colloid obtained, silicon particles are evenly dispersed in the solvent. The diameters of the silicon particles in the colloid can be varied by changing the composition or pressure of the atmosphere, the vaporization method, etc. The particle diameters are usually 50 nm or less, preferably 10 nm or less. In particular, ultrafine particles of 5 nm or smaller are preferred for the silicon colloid produced by the present invention. Silicon particle diameters larger than 50 nm are undesirable in that the thin silicon film formed by coating and drying such a silicon colloid has reduced homogeneity.

The concentration of silicon particles in the silicon colloid obtained by the process of this invention can be selected according to the intended use of the colloid. Usually, however, a concentration in the range of from 5 to 80% by weight is preferred. Silicon particle concentrations below 5% by weight are undesirable in that since application of such a colloid results in a very thin film, the operation for film formation should be conducted two or more times in order to form a thin silicon film having a given thickness. Silicon particle concentrations above 80% by weight are undesirable in that such a colloid has impaired stability.

If desired and necessary, a surfactant may be added to the silicon colloid for the purpose of enhancing the stability of the colloidal state. The surfactant for this use is not particularly limited in its kind, but it is desirably one which evaporates off during drying after coating. Preferred surfactants are higher aliphatic carboxylic acids having 10 to 20 carbon atoms, with oleic acid and stearic acid being especially preferred. These surfactants may be used usually at a concentration of 0.001 to 0.1% by weight based on the silicon colloid.

The silicon colloid thus obtained is coated on a substrate and the coating is dried to remove the solvent, whereby a thin silicon film can be formed. Coating methods are not particularly limited, and all of the techniques conventionally employed for forming thin films from metal colloids, e.g., spin coating and roll coating, are usable.

The material of the substrate on which the silicon colloid obtained by the invention is to be coated is not particularly limited. Although a suitable material may be usually selected, according to the intended use, from various kinds of plastics, metals, and ceramics, substrates having a smooth surface are desirable.

Conditions for the drying step after coating vary depending on the kind of the solvent used. However, the solvent is evaporated off by heating the coating at a temperature of usually from 50° to 300° C. for usually from 1 to 20 minutes.

The thin silicon film to be obtained by the present invention can be regulated to have an optimum thickness for the intended use by controlling the concentration of silicon particles in the silicon colloid or controlling the conditions for coating. For solar cells, thin silicon films having thicknesses of 0.2 to 10 μm are usually used.

It is desirable that the coating step and drying step be conducted in an inert gas atmosphere, e.g., nitrogen or argon.

As described above, the thin silicon film obtained from the silicon colloid produced by the process of this invention exhibits almost the same electrical properties as bulk silicon. Therefore, the silicon colloid is extremely useful for the formation of thin silicon films to be used as a semiconductor element in solar cells or other devices. This is a remarkable result which has been unable to be achieved with any conventional technique for metal colloid production.

The present invention will be explained below in more detail by reference to examples, but the invention is not construed as being limited thereto.

EXAMPLE 1

A silicon colloid was produced using the apparatus illustrated in Figure.

The inside of the apparatus was first evacuated sufficiently through an exhaust valve 9, and an atmosphere gas introduction valve 1 was then opened to introduce into the apparatus a mixed gas consisting of hydrogen and argon in a molar ratio of 1/2 so that the pressure inside a vaporization chamber 2 was kept at 30 Torr. A solvent vapor introduction valve 5 was then opened to introduce α-terpineol as a solvent. After the cooling of a cooling chamber 6 was initiated using liquid nitrogen 8 as a cooling agent, a heater 4 was heated to vaporize a silicon wafer 3 made of p-type silicon having a resistivity of 2.5 Ωcm. The resulting silicon particles each was covered with the α-terpineol solvent and came in this state into the cooling chamber 6, where the solvent-covered silicon particles deposited steadily to give a solid mass 7. This solid mass was gradually heated to room temperature to obtain a silicon colloid. The concentration of ultrafine silicon particles in this silicon colloid was 40% by weight. Examination with a transmission electron microscope revealed that the particle diameters ranged from 3.4 to 3.9 nm.

This silicon colloid was coated on a quartz glass by spin coating in a nitrogen atmosphere and the coated glass was heated at 250° C. for 10 minutes in a nitrogen-filled sealed oven to evaporate the solvent. As a result, a thin silicon film having a thickness of 1.5 μm was obtained.

The resistivity of this thin film was measured and found to be 2.4 Ωcm, which is almost equal to the resistivity of the silicon wafer used as a vaporization material.

EXAMPLE 2

A silicon colloid was obtained by conducting completely the same procedures as in Example 1 except that the partial pressure of hydrogen and that of argon were changed to 0.4 Torr and 1 Torr, respectively. The concentration of silicon particles in this silicon colloid was 37% by weight. Examination with a transmission electron microscope revealed that the particle diameters ranged from 3.2 to 3.5 nm.

From the silicon colloid obtained, a thin silicon film was then formed under completely the same conditions as in Example 1. The thin silicon film thus obtained had a thickness of 1.4 μm.

The resistivity of this thin film was measured and found to be 3.7 Ωcm, which is comparable to the resistivity of the silicon wafer used as a vaporization material.

EXAMPLE 3

A silicon colloid was obtained by conducting completely the same procedures as in Example 1 except that the partial pressure of hydrogen and that of argon were changed to 80 Torr and 100 Torr, respectively. The concentration of silicon particles in this silicon colloid was 45% by weight. Examination with a transmission electron microscope revealed that the particle diameters ranged from 11 to 41 nm.

From the silicon colloid obtained, a thin silicon film was then formed under completely the same conditions as in Example 1. The thin silicon film thus obtained had a thickness of 2.1 μm.

The resistivity of this thin film was measured and found to be 2.5 Ωcm, which is almost equal to the resistivity of the silicon wafer used as a vaporization material.

COMPARATIVE EXAMPLE 1

The same procedures as in Example 1 were conducted except that 100% argon gas was used in place of the hydrogen/argon=1/2 mixed gas used in Example 1 to collect a silicon colloid. This silicon colloid had a silicon particle concentration of 37% by weight and the particle diameters ranged from 3.6 to 4.1 nm.

A thin silicon film was formed from this silicon colloid in the same manner as in the Examples. This silicon film had a thickness of 1.7 μm.

The resistivity of this thin film was measured and found to be 72,000 Ωcm, which is far higher than the resistivity of the vaporization material. Thus, the thin silicon film obtained was unusable as a semiconductor element.

COMPARATIVE EXAMPLE 2

A silicon colloid was obtained by conducting completely the same procedures as in Example 1 except that the partial pressure of hydrogen and that of argon were changed to 0.1 Torr and 1 Torr, respectively. The concentration of silicon particles in this silicon colloid was 35% by weight. Examination with a transmission electron microscope revealed that the particle diameters ranged from 3.4 to 3.6 nm.

From the silicon colloid obtained, a thin silicon film was then formed under completely the same conditions as in Example 1. The thin silicon film thus obtained had a thickness of 1.4 μm.

The resistivity of this thin film was measured and found to be 25.2 Ωcm, which is higher by one order of magnitude than the resistivity of the vaporization material. Thus, the thin silicon film obtained was unusable as a semiconductor element.

COMPARATIVE EXAMPLE 3

A silicon colloid was obtained by conducting completely the same procedures as in Example 1 except that the partial pressure of hydrogen and that of argon were changed to 150 Torr and 150 Torr, respectively. The concentration of silicon particles in this silicon colloid was 43% by weight. Examination with a transmission electron microscope revealed that the particle diameters ranged from 35 to 160 nm.

From the silicon colloid obtained, a thin silicon film was then formed under completely the same conditions as in Example 1. The thin silicon film thus obtained had a thickness of 2.0 μm.

The resistivity of this thin film was measured and found to be 3.5 Ωcm, which is almost equal to the resistivity of the silicon wafer used as a vaporization material. However, the film obtained was so uneven that it was unusable as a semiconductor element.

As apparent from the above-described results of the Examples and Comparative Examples, it is possible to form a thin silicon film comparable to bulk silicon from the silicon colloid obtained in this invention by vaporizing silicon in the presence of hydrogen.

While the invention has been described in detail and with reference to specific embodiments thereof, it will be apparent to one skilled in the art that various changes and modifications can be made therein without departing from the spirit and scope thereof.

What is claimed is:

1. A process for producing a silicon colloid dispersion which comprises vaporizing silicon in the presence of hydrogen to form ultrafine particles of silicon, bringing the resulting silicon particles into contact with a solvent vapor, and condensing the solvent vapor to form a colloidal dispersion of said ultrafine silicon particles in said solvent.

2. The process for producing a silicon colloid dispersion as claimed in claim 1, wherein said hydrogen is used in an amount that the pressure thereof is from 0.2 to 100 Torr.

3. The process for producing a silicon colloid dispersion as claimed in claim 1, wherein said hydrogen is used in an amount that the pressure thereof is from 1 to 20 Torr.

4. The process for producing a silicon colloid dispersion as claimed in claim 1, wherein said solvent represents an ether, an alcohol or an ester.

5. The process for producing a silicon colloid dispersion as claimed in claim 1, wherein said solvent represents an alcohol having 1 to 15 carbon atoms.

6. The process for producing a silicon colloid dispersion as claimed in claim 1, wherein the particle diameter of silicon particles dispersed in said silicon colloid are 50 nm or less.

7. The process for producing a silicon colloid dispersion as claimed in claim 1, wherein the particle diameters of silicon particles dispersed in said silicon colloid are 10 nm or less.

8. The process for producing a silicon colloid dispersion as claimed in claim 1, wherein the particle diameter of silicon particles dispersed in said silicon colloid are 5 nm or less.

9. The process for producing a silicon colloid dispersion as claimed in claim 1, wherein silicon particles are dispersed in said silicon colloid in an amount of 5 to 80% by weight.

10. The process as claimed in claim 1, wherein said vaporizing is conducted in the presence of an inert gas in addition to hydrogen.

11. The process as claimed in claim 10, wherein said inert gas is selected from the group consisting of helium, neon, argon, krypton, xenon, and radon.

12. The process as claimed in claim 10, wherein said inert gas is argon.

13. The process as claimed in claim 10, wherein said inert gas is present in an amount of up to 10 mol per mol of hydrogen.

14. The process as claimed in claim 10, wherein said inert gas is present in an amount of from 1 to 5 mol per mol of hydrogen.

15. A process for producing a silicon colloid dispersion which comprises:

(a) vaporizing silicon in an atmosphere consisting essentially of hydrogen up to 10 mol of an inert gas per mol of hydrogen;

(b) condensing silicon vaporized in step (a) to form fine silicon particles, (c) bringing said silicon particles into contact with a vaporized solvent to cover the silicon particles with solvent, and (d) condensing and collecting the solvent covered silicon particles to obtain said silicon colloid.

* * * * *